United States Patent [19]
Ishida

[11] Patent Number: 5,535,816
[45] Date of Patent: Jul. 16, 1996

[54] HEAT SINK

[75] Inventor: Yoshio Ishida, Osaka, Japan

[73] Assignee: Diamond Electroic Mfg. Co. Ltd., Osaka, Japan

[21] Appl. No.: 294,830

[22] Filed: Aug. 29, 1994

[30]   Foreign Application Priority Data

Oct. 15, 1993 [JP] Japan .................................. 5-281778
Nov. 24, 1993 [JP] Japan .................................. 5-319126

[51] Int. Cl.$^6$ ................................. F28F 7/00; F28F 3/04
[52] U.S. Cl. ................................. 165/80.3; 165/104.33; 165/185; 174/16.3; 257/722; 361/704; 361/709
[58] Field of Search ................................. 165/80.3, 80.4, 165/104.33, 185; 174/16.3; 257/713, 715, 721, 722; 361/690, 698, 692, 700–4, 707, 709; 29/890.039, 890.04

[56]   References Cited

U.S. PATENT DOCUMENTS

| | | | |
|---|---|---|---|
| 2,647,731 | 8/1953 | Ludlow | 165/185 |
| 3,449,172 | 6/1969 | Dingwall | 165/185 |
| 4,449,578 | 5/1984 | Munekawa | 165/104.33 |
| 4,884,631 | 12/1989 | Rippel | 165/185 |
| 5,381,859 | 1/1995 | Minakami et al. | 165/80.3 |

FOREIGN PATENT DOCUMENTS

| | | | |
|---|---|---|---|
| 85049 | 6/1980 | Japan | 165/185 |
| 10800 | 1/1990 | Japan | 361/704 |
| 149867 | 6/1993 | Japan | 165/185 |
| 1811044 | 4/1993 | U.S.S.R. | 361/709 |

OTHER PUBLICATIONS

Author unknown, "Heat Sink Fabrication Method", IBM Technical Disclosure Bulletin, vol. 27, No. 10A, Mar. 1985, pp. 5656–5657.

Horvath, J. L., "Metal Cooling Fins for a Semiconductor Package", IBM Technical Disclosure Bulletin, vol. 26, No. 7A, Dec. 1983.

*Primary Examiner*—Leonard R. Leo
*Attorney, Agent, or Firm*—Longacre & White

[57]   ABSTRACT

A heat sink comprising a heat receiving plate and at least one piece of heat radiating fin stacked on the heat receiving plate, wherein slits which penetrate the heat radiating fin from the upper to lower surface are formed on a flat plate surface of the heat radiating fin, and a plurality of fin protrusions are provided in a portion on the flat plate surface where the slits are not formed, and all the fin protrusions or a portion of the fin protrusions of the stacked heat radiating fin are disposed at different positions on the heat radiating fin so that an interval between the heat receiving plate and heat radiating fin, or an interval between the stacked heat radiating fins is maintained by the fin protrusions.

9 Claims, 7 Drawing Sheets

HEAT SINK

BACKGROUND OF THE INVENTION

1. Field of the Invention

The present invention relates to a heat sink used for a semiconductor element in a Large Scale Integrated (LSI) circuit of high heating density provided in a microcomputer driven at high speed, and also relates to a heat sink used for a semiconductor element used for a thyristor of middle capacity and a power transistor. More particularly, the present invention relates to an air-cooled type compact heat sink in which generated heat is dispersed by air for cooling.

2. Description of Related Art

FIG. 13 is a perspective view and FIG. 14 is a side view of an example in which a conventional heat sink is mounted on a QFP (Quadrangle Flat Package) type LSI of a ceramic package. In FIGS. 13 and 14, numeral 90 is a heat sink made of highly heat conductive material such as aluminum and copper. The heat sink 90 is manufactured by means of machining so that a fin portion 92 is formed in the periphery of a heat conductive support portion 91. A central portion of the heat conductive support portion 91 is closely contacted with and mounted on a central surface of the QFP type LSI 93 which is a heat source. Therefore, heat generated by the LSI 93 is radiated by the fin portion 92.

In the heat sink 90 constructed in the manner described above, unless the diameter d1 of the fin portion 92 is extended or the number of the fins is increased in accordance with the increase of heat generated by the LSI 93, that is, unless the surface area of the fin portion 92 of the heat sink 90 is increased, sufficient heat radiating effects can not be provided. However, in the case where the diameter d1 of the heat sink 90 becomes larger than the outer diameter of the LSI 93, or in the case where the height H of the heat sink 90 is increased too much, the following problems may be encountered:

when such a large heat sink 90 is disposed in a limited small space in an electronic apparatus, a convection of air is obstructed, so that the cooling capacity is remarkably lowered;

even when it is permitted that the dimensions of the heat sink 90 are increased, in the case where the diameter d1 of the fin portion 92 is simply extended or the number of the fins is simply increased, a distance from the heat source (LSI 93) is increased, so that the heat resistance of the material composing the heat sink 90 is increased. Therefore, it is necessary to increase the thickness t1 of the fin, and to extend the diameter d2 of the heat conductive support 91. Accordingly, as a measure to be taken against the increase of heat generated in the LSI, not only the dimensions of the heat sink are increased but also a large capacity motor to drive a cooling fan is necessary for a forced convection. Consequently, the costs are raised;

the machining of the heat sink 90 is restricted by the heat sink material, mechanical strength of a cutting tool and cutting accuracy, thus a ratio of the diameter d2 of the heat conductive support 91 to the diameter d1 of the fin portion 92 is limited since the fin interval t2 necessary for an appropriate convection must be maintained. For this reason, when the heat sink 90 is made compact, the reduction of thickness t1 of the fin is limited;

further, in the conventional heat sink 90, it is necessary to provide the heat conductive support 91. Therefore, heat is accumulated among closely stacked fins under the condition of a natural convection or a gentle wind, so that heat is not effectively radiated.

SUMMARY OF THE INVENTION

The present invention has been achieved in view of the above problems. It is an object of the present invention to provide a heat sink construction which is small and light so as to improve the heat radiating properties.

In order to solve the above problems, the present invention provides a heat sink 10 comprising: a heat receiving plate 11; and at least one piece of heat radiating fin 12 stacked on said heat receiving plate 11, wherein slits 15 which penetrate said heat radiating fin 12 from the upper to lower surface are formed on a flat plate surface of said heat radiating fin 12, and a plurality of fin protrusions 12a are provided in a portion on the flat plate surface where the slits 15 are not formed, and all the fin protrusions 12a or a portion of the fin protrusions 12a of the stacked heat radiating fin 12 are disposed at different positions on the heat radiating fin 12 so that an interval between said heat receiving plate 11 and heat radiating fin 12, or an interval between the stacked heat radiating fins 12 is maintained by said fin protrusions 12a.

The flat plate surface of the heat radiating fin 12 may be disposed approximately perpendicular to the heat receiving plate 11, and the heat receiving plate 11 may be provided with a fin guide 11a, and the heat radiating fin 12 may be supported by the fin guide 11a.

Heat pipes 50 may be disposed in all or a portion of the spaces formed in the heat sink 10.

According to the construction described before, diffused heat on the heat receiving plate 11 can be conducted to the far heat radiating fin 12 among the stacked heat radiating fins 12 through the fin protrusions 12a of each heat radiating fin 12, taking the shortest course. Accordingly, in this heat sink, heat can be uniformly radiated. When the slits and fin protrusions are provided, it is not necessary to give consideration to an elongation percentage of the fin in the process of press forming, so that the fins can be stably soldered. Due to the construction of the slits and fin protrusions, convection of air can be quickly made with respect to not only a cooling wind sent from the side but also a cooling wind sent from the upper surface, so that the cooling efficiency of the fins can be improved. As a result, an interval (pitch) between the fins can be reduced to a minimum. Accordingly, a cooling wind sent from the upside can be effectively used for cooling compared with the construction in which a large number of circular holes are formed.

DETAILED DESCRIPTION OF THE INVENTION

Figure 1:
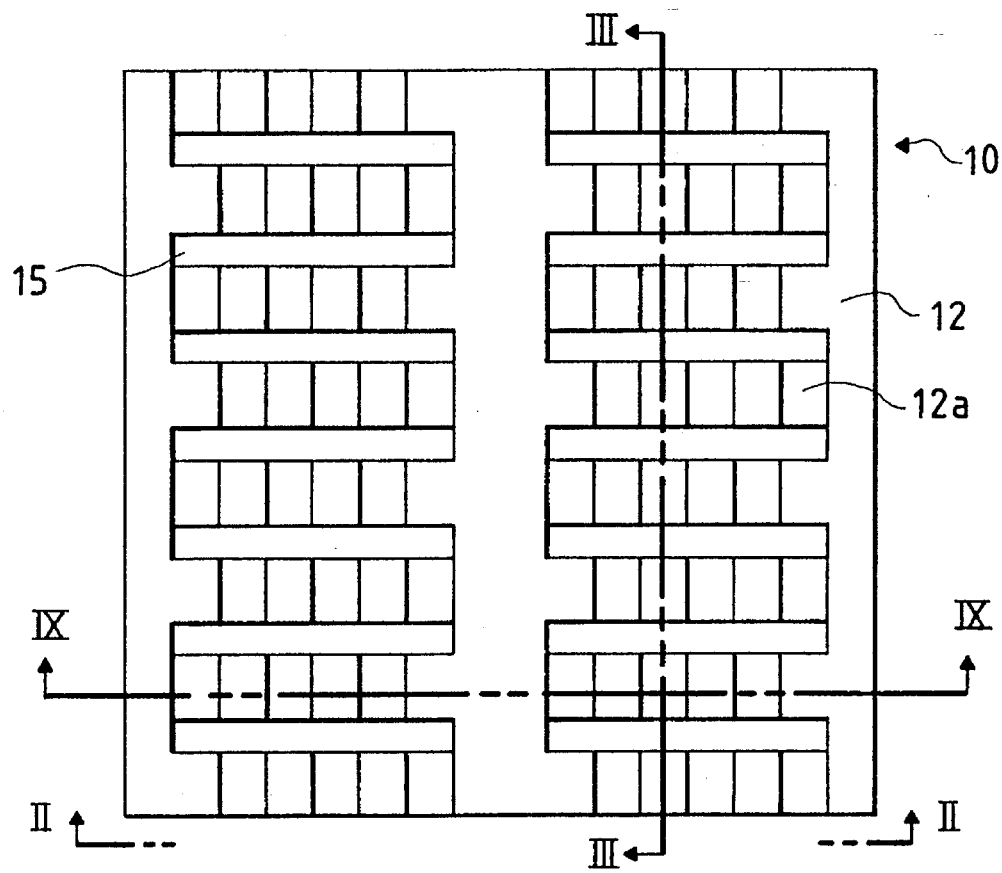
FIG. 1 is a top view of the heat sink of the first embodiment of the present invention.
Figure 2:
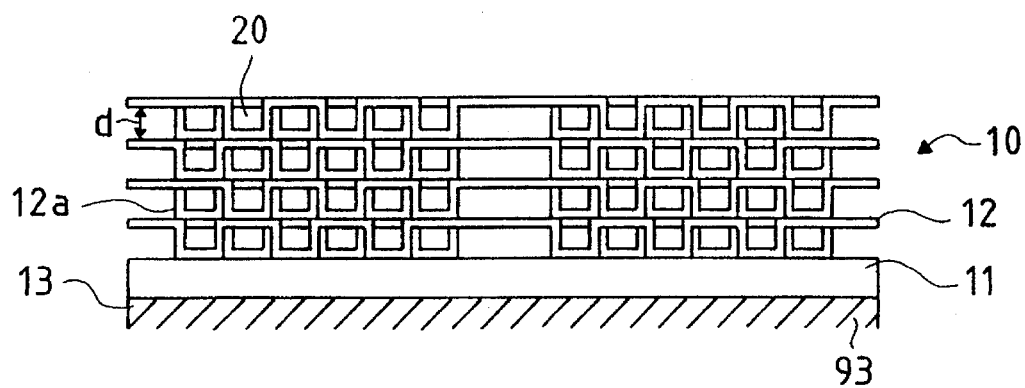
FIG. 2 is a side view taken in the direction of line II—II in FIG. 1.
Figure 3:
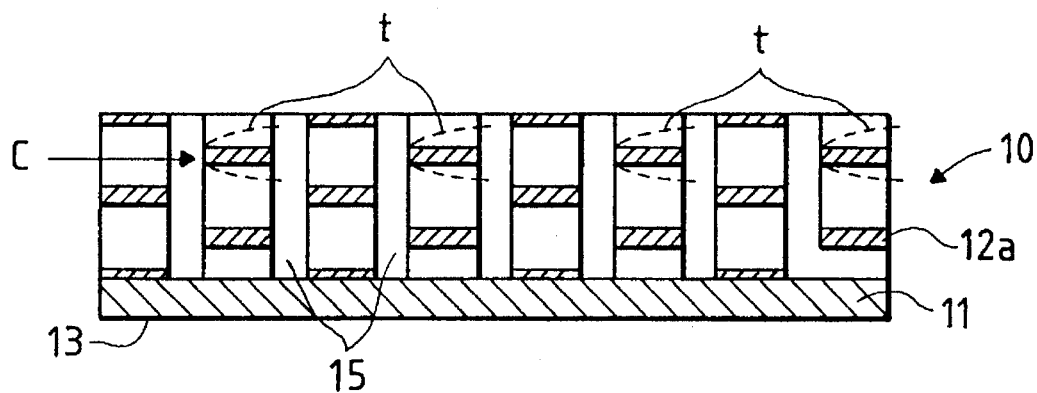
FIG. 3 is a sectional view taken on line III—III in FIG. 1.

FIG. 1 is an upper view of the heat sink of the first embodiment of the present invention, FIG. 2 is a side view as seen along line II—II of FIG. 1, and FIG. 3 is a sectional view taken on line III—III in FIG. 1.

In FIGS. 1, 2 and 3, the heat sink 10 is constructed in the following manner:

The heat receiving plate 11 is made of a flat quadrilateral plate of heat conductive metal such as aluminum and copper. One surface of the heat receiving plate 11 is used as a heat receiving surface 13 and attached to a heat generating body 93, and four heat radiating fins 12 are sequentially attached to the other surface of the heat receiving plate 11 so that the heat conducted by the heat receiving plate 11 can be effectively radiated.

The area of the flat surface of each heat radiating fin 12 is approximately the same as that of the heat receiving plate 11. A large number of fin protrusions (protrusions formed by press forming) 12a, which will be described later, are provided downward on the heat radiating fins 12. The fin protrusions 12a are joined with an opposed surface of the heat radiating fin 12 by means of soldering, so that a space 'd' is made between the heat radiating fins 12. In this way, an air convection passage 20 is formed, and a heat conduction passage is formed between each heat radiating fin 12 and the heat receiving plate 11.

Figure 4:
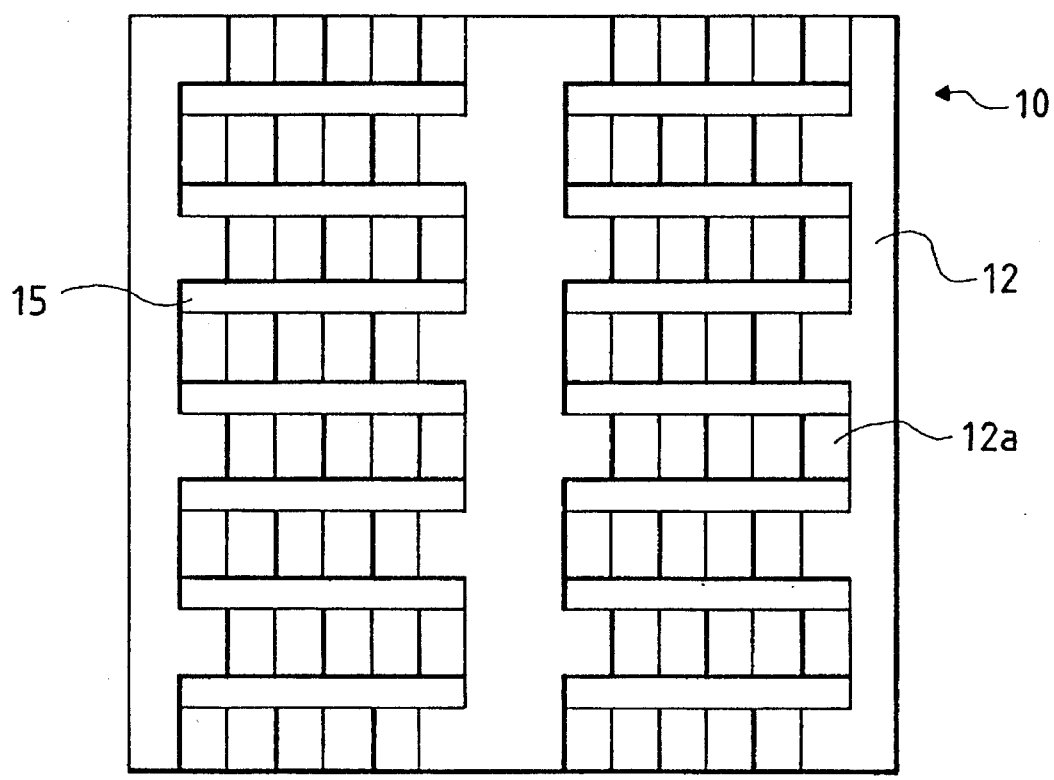
FIG. 4 is a top view of the second heat radiating fin of the embodiment of the present invention.

As shown in FIGS. 1 and 4, a plurality of rectangular slits 15 penetrating the flat surface of the heat radiating fin 12 from the upper to the lower surface are formed on the flat surface of the heat radiating fin 12 symmetrically with respect to a longitudinal center line of the heat radiating fin 12. The fin protrusions 12a of the heat radiating fin 12 formed by means of press forming are orderly aligned between the plurality of adjacent slits 15.

Figure 6:
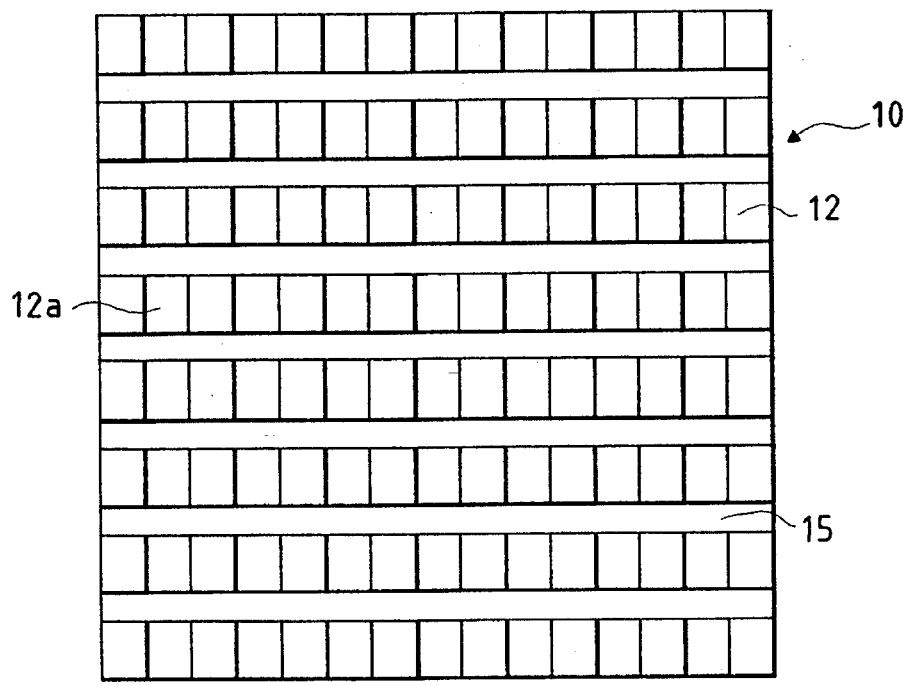
FIG. 6 is a top view of the heat radiating fin in which the slits divided into two groups on the upper surface of the heat radiating fin in FIG. 1, are integrated into one group.

Profiles of the fins 12 to be stacked are different. For example, the profiles of the first and third fins stacked on the heat receiving plate 11 are shown in FIG. 4, and the profiles of the second and uppermost fourth fins stacked on the heat receiving plate 11 are shown in FIG. 1. As shown in the side view of FIG. 2, a position of each fin protrusion 12a is determined in such a manner that each fin protrusion 12a dose not coincide with the fin protrusion 12a of the heat radiating fin 12 to be stacked. The construction described above can be accomplished by the two types of heat radiating fins 12 illustrated in FIGS. 1 and 4. However, as illustrated in FIG. 6 in which the adjacent fin protrusions 12a are aligned in parallel, in the case where all or a portion of the fin protrusions 12a of the stacked heat radiating fins are not disposed at the same position, one type of heat radiating fin may be employed and reversely disposed. In the case where the fin protrusions 12a can be formed by means of press-forming, all types of profiles may be used for the heat radiating fins 12. The aforementioned slits 15 are independently formed in the right and left portions on the flat surface of the heat radiating fin 12. However, as illustrated in FIG. 6, the slits 15 distributed in the right and left portions may be integrated into one portion unless any problems are caused in the press forming process of the fin protrusions 12a. Profile of the heat radiating fin 12 provided on the heat radiating plate 11 is not necessarily the same as that of the heat receiving plate 11. A plurality of heat radiating fins 12, the profiles of which are smaller than the profile of the heat receiving plate 11, may be disposed on the surface of the heat radiating fin 12, and other various cases may be considered. Further, the slit 15 is not limited to a specific profile such as a rectangle. Of course, the profiles of the slit 15 and protrusions 12a of the heat radiating fins 12 to be used may be changed for the purpose of a convection guide and printing.

Figure 5:
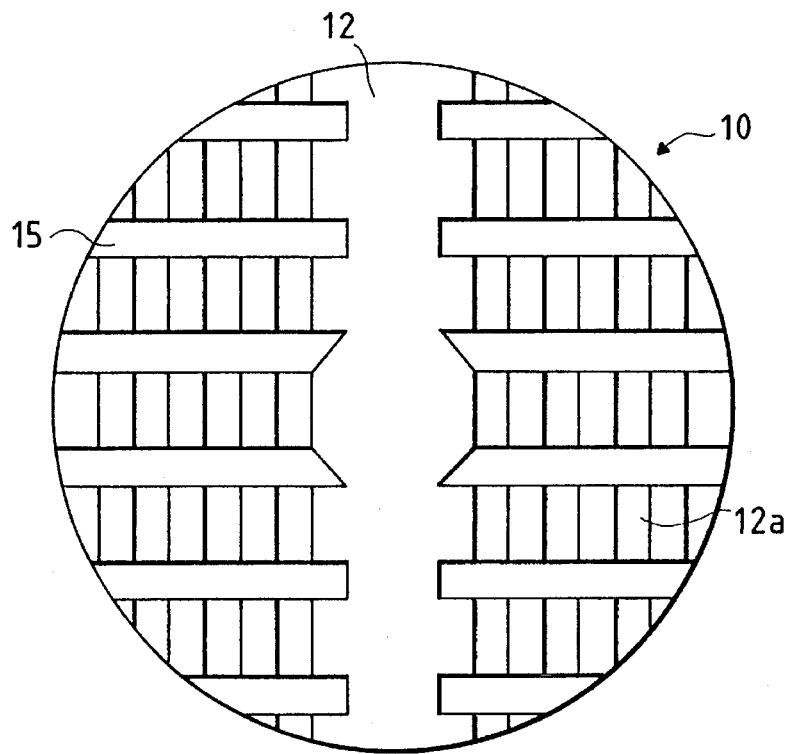
FIG. 5 is a top view of the heat sink having circular heat radiating fins.
Figure 7:
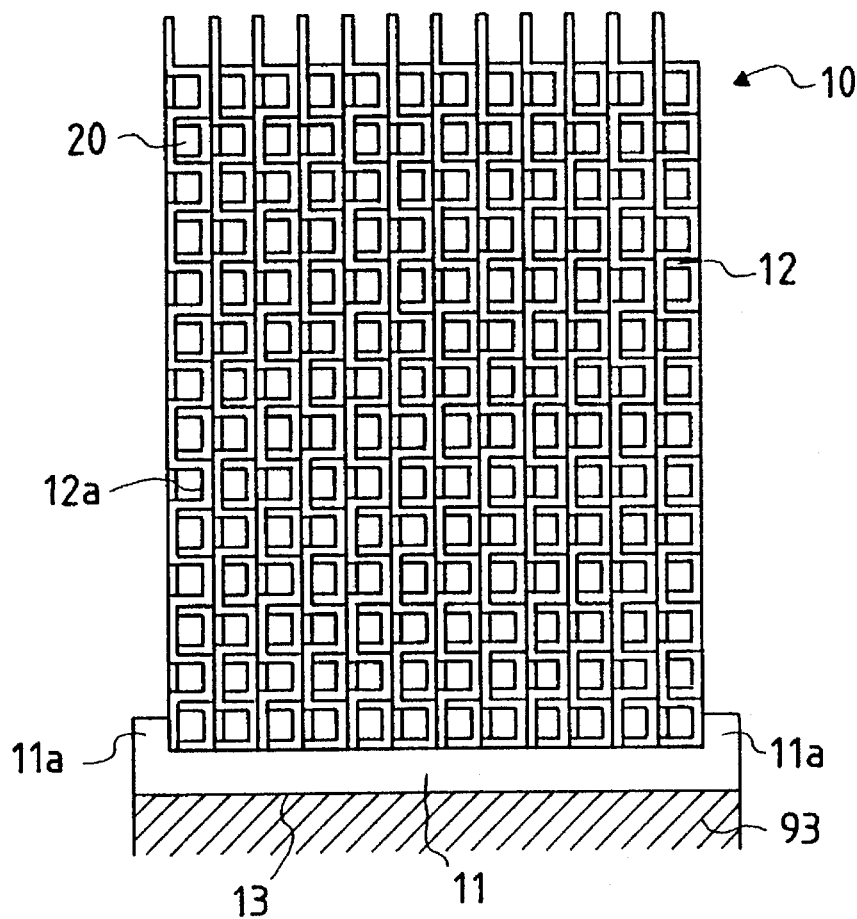
FIG. 7 is a heat sink in which the heat radiating fins are longitudinally disposed with respect to the heat receiving plate.

In the above example, the upper profile of the heat sink 10 is approximately square. When consideration is given to the installation area and heat radiating efficiency, the profile of the heat sink 10 may be circular as illustrated in FIG. 5 or polygonal. In the above example, as illustrated in FIG. 2, the heat radiating fins 12 are laterally disposed on the heat receiving plate 11 so that the bottom surfaces of the protrusions of the heat radiating fins 12 are joined with the heat receiving plate 11 so that they can be fixed. In the case where the number of the heat radiating fins 12 is increased and a large number of fins are stacked, the heat radiating fins 12 may be longitudinally disposed as illustrated in FIG. 7, and the sides of the fin protrusions 12a may be fixed onto the heat receiving plate 11. In this case, when fin guides 11a are attached when edge portions of the heat receiving plate 11 are bent, the heat radiating fins 12 can be easily fixed. In general, the fin 12 is made of a blazing sheet in which both sides of an aluminum core are clad with solder. The heat sink 10 is constructed in the following manner. The uppermost heat radiating fin 12 and the lowermost heat receiving plate 11 are provisionally fixed, and put into a furnace, the temperature of which is lower than the fusing point of the core member of the blazing sheet and higher than the fusing point of the solder. After the solder has been fused, it is cooled. In this way, the fin protrusions 12a of the heat radiating fin 12 are soldered onto all contacting surfaces, and the fin protrusions 12a and the heat receiving plate 11 are also soldered.

In this case, the heat sink 10 is attached to the heat generating body 93 using solder and also using an adhesive agent such as highly heat-conductive epoxy resin and silver paste, or using silicon grease and an exclusive cramp. In this case, while consideration is given to the adhesive strength, it is preferable that the entire lower surface of the heat receiving plate 11 is closely attached to the heat generating element such as an LSI without forming a step portion on the lower surface, as compared with a design in which the diameter of the heat receiving surface 13 is made smaller than the outer diameter of the heat receiving plate 11 in order to increase the heat radiating area.

In the above heat sink 10, heat generated by the heat generating body 93 is conducted to the fin protrusions 12a and all over the heat radiating fin 12 through the heat receiving plate 11. Since the thickness of the heat receiving plate 11 is appropriate with respect to its outer diameter, for example, since the thickness of the heat receiving plate 11 is 2 mm with respect to a square, the length of the side of which is 50 mm, heat on the heat receiving surface 13 is uniformly conducted to all the surface of the heat receiving plate 11 even when the area of the heat receiving surface 13 is small. On the other hand, in the heat radiating fin 12 composed of a standard blazing sheet, the thickness of the heat radiating fin 12 is small with respect to the thickness of the heat receiving plate 11, that is, the thickness of the heat radiating fin 12 is only 0.5 mm. However, heat uniformly conducted to the heat receiving plate 11 is first conducted to all over the surface of the heat radiating fin 12 through a large number of protrusions 12a of the heat radiating fin 12 directly coming into contact with the heat receiving plate 11. Successively, heat conduction is performed on each of the upper heat radiating fins 12 through the fin protrusions 12a of each fin. In this way, heat is dispersed in the entire heat sink 1 and the dispersed heat is radiated.

Figure 8:
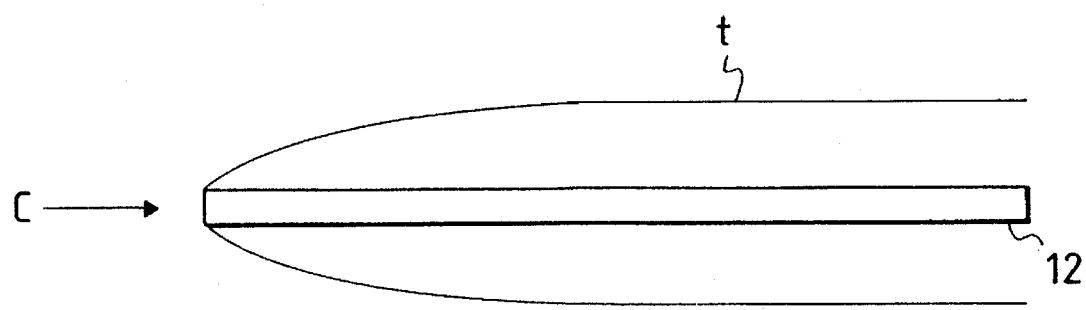
FIG. 8 is a schematic illustration showing a convection when a forcible convection is given to the conventional heat radiating fin.

As it is well known, FIG. 3 illustrates a thermal boundary layer t' caused by a convection 'c' in the case where the slit 15 is formed in the heat radiating fin 12. On the other hand, FIG. 8 illustrates a thermal boundary layer 't'caused by a convection 'c' in the case of a conventional smooth fin 12 in which the slit 15 is not formed. In this case, the film heat resistance of the heat radiating fin 12 is extremely increased. Consequently, as illustrated in FIGS. 3 and 8, in the heat radiating fin 12 having the slit 15, the thermal conductivity of the fin 12 with respect to air is improved under the condition of a forced convection. Therefore, it is possible that the heat is uniformly radiated from the entire surface of the heat radiating fin 12.

In the conventional heat sink 90, the heat conductive support 91 is required. Therefore, under the condition of a natural convection or a gentle wind, heat is accumulated between closely stacked fins, so that heat can not be effectively radiated. However, in the above example, a gap 'd' is formed by a plurality of protrusions 12a between the stacked heat radiating fins 12. Therefore, the heat conductive support can be omitted.

In the heat sink described above, the core of the heat radiating fin 12 is formed of a flat sheet made of aluminum alloy. However, this core may be formed of a fused wire net having aperture made of copper or aluminum.

In general, the heat receiving plate 11 of the heat sink is attached to a package of the existent LSI (heat generating body) made of metal such as aluminum. However, the aforementioned heat receiving plate 11 may be composed of heat pipes so that it can meet the demand of extending the dimensions, and when the aforementioned heat receiving plate 11 is composed of a ceramic plate made of alumina, aluminum nitride and silicon carbide so that the thermal expansion coefficient can be the same as that of the semiconductor chip, and when the heat receiving plate 11 is directly joined with the semiconductor chip such as an LSI, the cooling effect can be more improved. At this time, the heat receiving plate 11 formed of the ceramic plate described above, and the heat radiating fin 12 can be relatively easily joined when the joining sides of the heat receiving plate 11 and heat radiating fin 12 are subjected to printing-sintering of metal such as nickel alloy.

Figure 9:
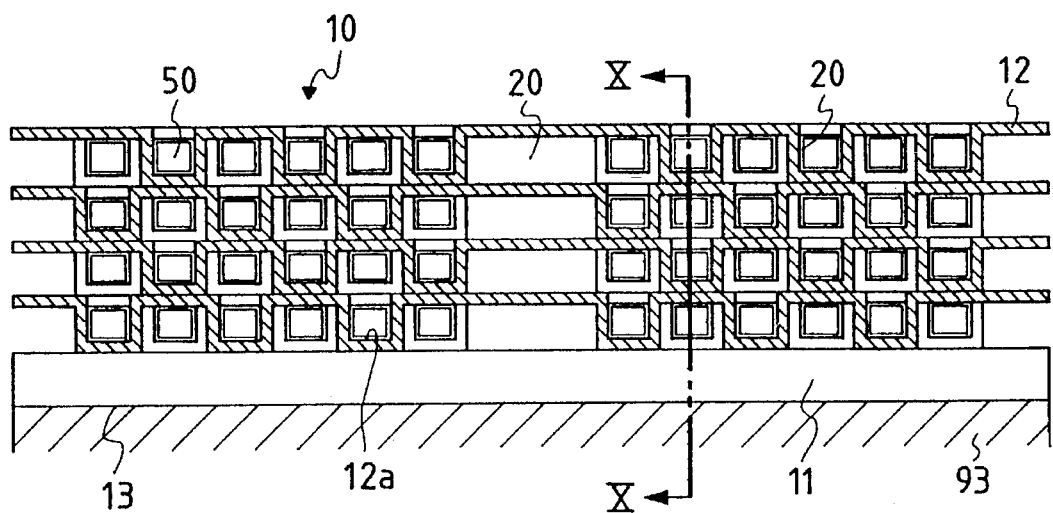
FIG. 9 is a sectional view of the heat sink in which the heat pipes are embedded in the air convection passage as viewed along line IX—IX in FIG. 2.
Figure 10:
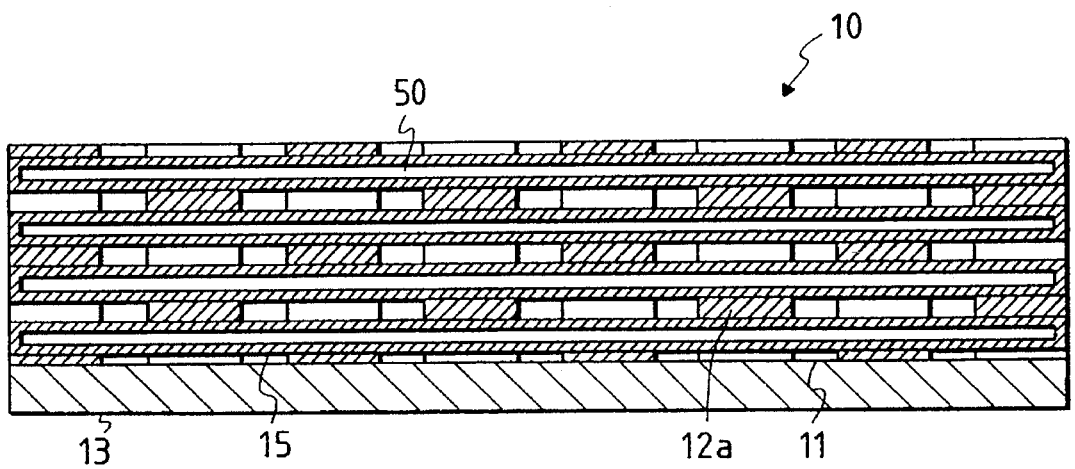
FIG. 10 is a sectional view taken on line X—X in FIG. 9.
Figure 11:
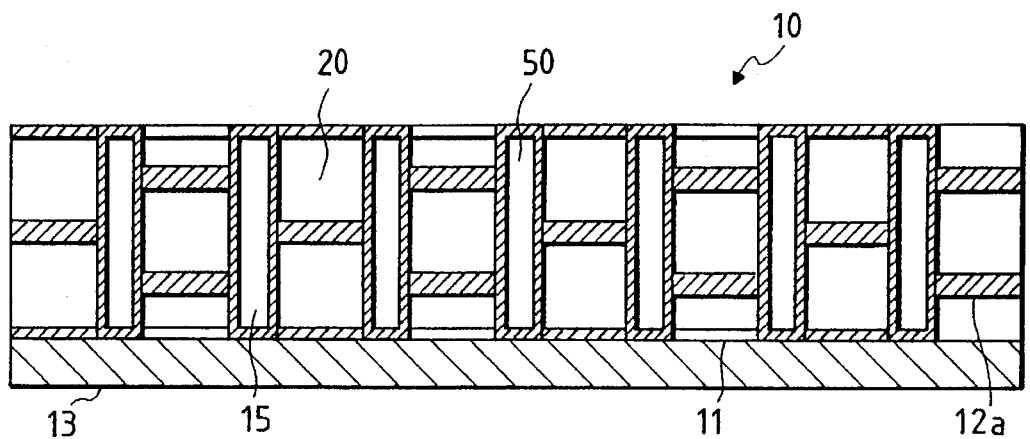
FIG. 11 is a sectional view of the heat sink in which the heat pipes are embedded in the slits shown in FIG. 2.

The second example of the present invention is shown in FIGS. 9, 10 and 11. FIG. 9 is a sectional view taken along line IX—IX in FIG. 1. FIGS. 10 and 11 are sectional views taken on line X—X in FIG. 9. In FIGS. 9 and 10, a heat pipe 50 is embedded in the air convection passage 20 (space) formed in the heat sink 10 explained in the first example described before, so that the heat in the heat radiating fin 12 can be uniformly dispersed. The heat pipe 50 may be provided in all the air convection passages 20, or in a portion of the air convection passages 20 while consideration is given to a forced convection. In FIGS. 9 and 10, the heat pipe 50 is disposed in parallel with the heat receiving plate 11. However, as illustrated in FIG. 11, the heat pipe 50 may be embedded in the slit 15 so that it is disposed in a direction perpendicular to the heat receiving plate 11. Alternatively, while consideration is given to a forced convection, the heat pipe 50 parallel with the heat receiving plate 11 may be combined with the heat pipe 50 perpendicular to the heat receiving plate 11.

Figure 12:
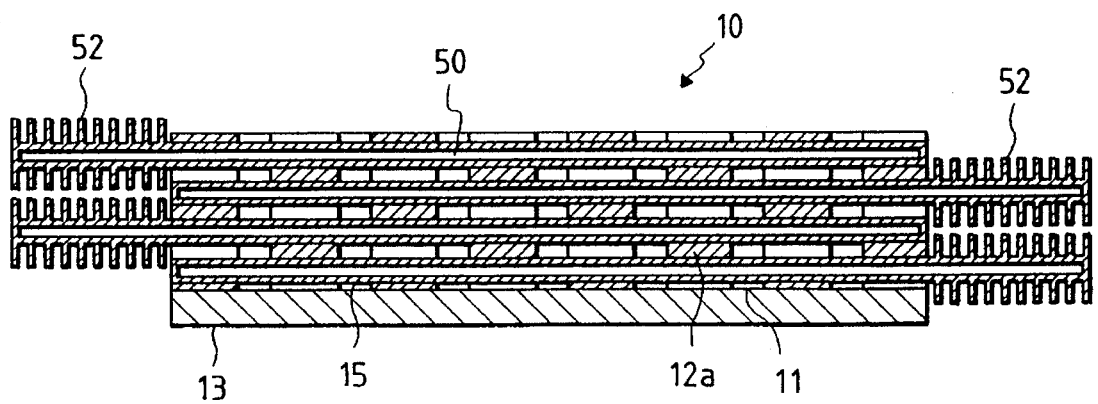
FIG. 12 is a sectional view of the heat sink in which the heat pipes are provided with a protruded portion on which the heat pipe fins are mounted.
Figure 13:
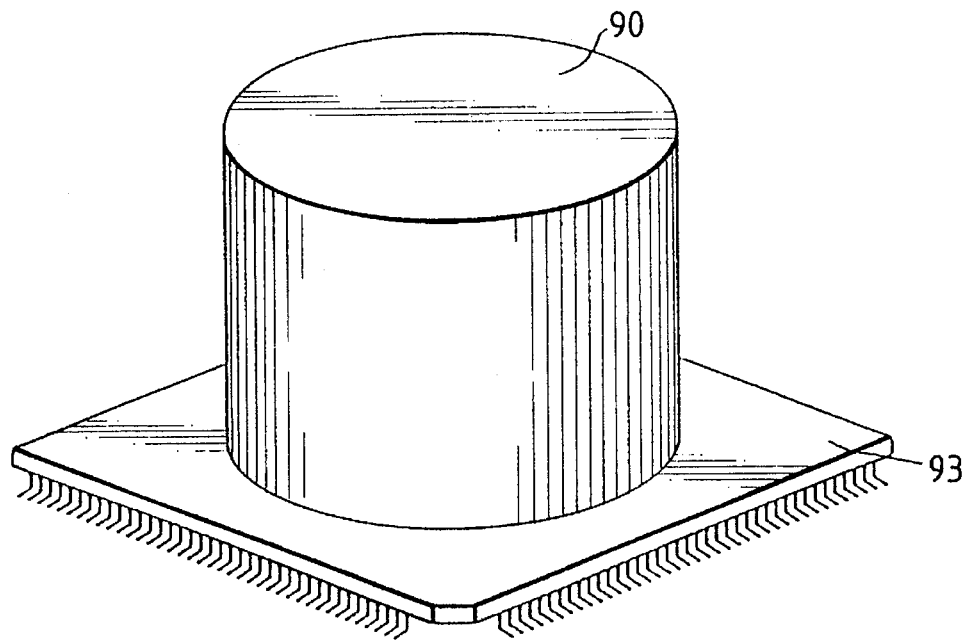
FIG. 13 is a perspective view of the conventional heat sink.
Figure 14:
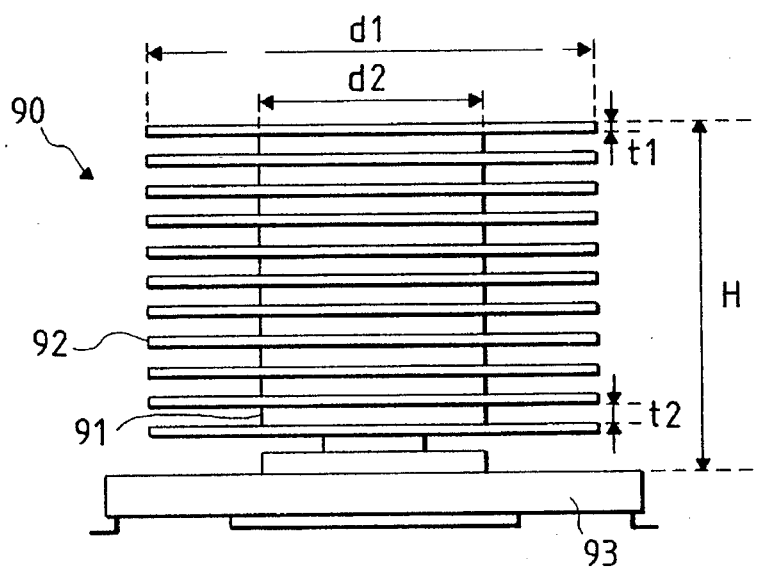
FIG. 14 is a side view of the conventional heat sink.

Further, in the case where a sufficient installation space is provided for the heat sink 10, the heat pipe 50 may be protruded from the contour of the heat sink 10. In this way, excellent heat radiating effects can be provided. When the heat pipe fins 52 are attached to all the protrusion or a portion of the protrusion, more excellent heat radiating effects can be provided. In the construction shown in FIG. 12, two protrusions are disposed on both sides in such a manner that the protrusions on the right and those on the left are staggered. However, the construction can be arbitrarily designed in accordance with the intervals of the heat radiating fins 12, and even when the heat pipe 50 is disposed in the slit 15, the protrusions can be added in the same manner.

In the above example, the section of the heat pipe 50 is rectangular, however, even when the section is circular or elliptic, the same excellent effect can be provided.

As described above in detail, according to the present invention, a heat-conductive heat receiving plate and a heat radiating fin are soldered at an arbitrary position. Therefore, the mechanical strength of the heat sink is high, and heat can be uniformly diffused in the heat sink, and further the surface area is large and the weight is small, so that the heat sink can be made compact. In the heat sink, the heat-conductive support 91 can be omitted, so that a heat accumulation can be avoided in the closely stacked fins even under the condition of a natural convection and gentle wind, and the convection can be facilitated. Consequently, it is possible to provide a heat sink in which convention can be effectively generated.

Concerning the manufacturing method, the conventional heat sinks are mainly manufactured by means of cutting, however, according to the present invention, the heat sinks are made by means of press forming and soldering. Accordingly, even when heat pipes are provided in spaces formed in the heat receiving plate and the heat sink 10, the heat sink can be supplied at a relatively low cost, so that they can be applied to a mass-produced semiconductor such as an LSI. When the slits 15 and fin protrusions 12a are provided as shown in the above construction, it is not necessary to give consideration to the elongation percentage of fin material in the process of press forming, so that soldering can be stabilized. In this connection, a profile of the upside of the heat sink 10 is square in the embodiment of the present invention, however, this profile may be formed circular of polygonal, and further when holes are appropriately formed, the heat radiating area can be arbitrarily changed.

In general, an interval between the heat radiating fins 12 adjacent to each other is maintained by the height of the fin protrusion 12a in one direction. However, when fin protrusions 12a of the opposing heat radiating fins 12 are butted against each other, the interval between the stacked heat radiating fins 12 can be extended.

In the case of a conventional heat sink, when the interval of the heat radiating fins is reduced, an air accumulation is caused between the fins, so that the cooling effect of the fins is lowered. Due to the construction of the slits 15 and fin protrusions 12a, convection of air can be quickly made with respect to not only a cooling wind sent from the side but also a cooling wind sent from the upper surface, so that the cooling efficiency of the fins can be improved. As a result, an interval 'd' (pitch) of the fins can be reduced to a minimum. Accordingly, a cooling wind sent from the upside can be effectively used for cooling compared with the construction in which a large number of circular holes are formed.

What is claimed is:

1. A heat sink comprising: a heat receiving plate adapted to be mounted on a heat generating body; and at least one heat radiating fin stacked on said heat receiving plate, wherein slits which pass through said heat radiating fin are formed on a first portion of a flat plate surface of said heat radiating fin, and a plurality of fin protrusions are provided in a second portion on the flat plate surface, a first grouping of said plurality of fin protrusions is aligned and located along an edge of one of said slits and a second grouping of said plurality of fin protrusions is aligned and located along an opposite edge of said one of said slits, wherein each grouping is provided with a vally between adjacent fin protrusions, said valleys of said first grouping being aligned with said fin protrusions of said second grouping such that the fin protrusions of said first and second groupings are alternately provided along said edges of said one of said slits, wherein an interval between said heat radiating fin and one of said heat receiving plate and additional heat radiating fins is maintained by said fin protrusions.

2. The heat sink according to claim 1, wherein bottom surfaces of the fin protrusions of the stacked heat radiating fin are joined with a portion of an adjacent heat radiating fin to define said interval.

3. The heat sink according to claim 1, wherein each of said heat radiating fins defines a horizontal plane, and are stacked in a vertical direction, wherein said stacked heat radiating fins are adapted to receive convection air in both said horizontal and said vertical directions.

4. A heat sink comprising: a heat receiving plate adapted to be mounted on a heat generating body; and at least one heat radiating fin stacked on said heat receiving plate, wherein slits which pass through said heat radiating fin are formed on a first portion of a flat plate surface of said heat radiating fin, and a plurality of fin protrusions are provided in a second portion on the flat plate surface, wherein an interval between said heat radiating fin and one of said heat receiving plate and additional heat radiating fins is maintained by said fin protrusions, wherein heat pipes are disposed in at least one space formed between said stacked heat radiating fins.

5. A heat sink for dissipating heat from a heat generating body comprising:

a heat receiving plate adapted to be mounted on said heat generating body;

a plurality of heat radiating fins stacked on said heat receiving plate in a vertical direction, wherein slits are formed on a first portion of a flat plate surface of said heat radiating fin, and a plurality of fin protrusions are provided in a second portion on the flat plate surface, wherein said stacked heat radiating fins are adapted to receive convection air in said vertical direction, and wherein a grouping of said plurality of fin protrusions is aligned in a row along an edge of one of said slits.

6. The heat sink according to one of claims 5, wherein bottom surfaces of the fin protrusions of the stacked heat radiating fin are joined with a portion of an adjacent heat radiating fin so that an interval between the stacked heat radiating fins is maintained by said fin protrusions.

7. A heat sink for dissipating heat from a heat generating body comprising:

a heat receiving plate adapted to be mounted on said heat generating body;

a plurality of heat radiating fins stacked on said heat receiving plate, wherein slits are formed on a flat plate surface of said heat radiating fin, and a plurality of fin protrusions are provided in a portion on the flat plate surface, and bottom surfaces of the fin protrusions of the stacked heat radiating fin are joined with a portion of an adjacent heat radiating fin so that an interval between the stacked heat radiating fins is maintained by said fin protrusions a first grouping of said plurality of fin protrusions is aligned and located along an edge of one of said slits and a second grouping of said plurality of fin protrusions is aligned and located along an opposite edge of said one of said slits, wherein each grouping is provided with valley between adjacent fin protrusions, said valleys of said first grouping being aligned with said fin protrusions of said second grouping such that the fin protrusions of said first and second groupings are alternately provided along said edges of said one of said slits, and wherein the flat plate surface of said heat radiating fin is longitudinally disposed and joined with said heat receiving plate so that said heat radiating fin makes an approximate right angle with said heat receiving plate.

8. The heat sink according to claim 7, wherein said heat receiving plate is provided with a fin guide, and said heat radiating fin is supported by said fin guide.

9. The heat sink according to one of claims 7, wherein heat pipes are disposed in at least one space formed between said stacked heat radiating fins.

* * * * *